United States Patent
Saib et al.

(10) Patent No.: US 10,522,328 B2
(45) Date of Patent: Dec. 31, 2019

(54) METHOD OF PERFORMING DOSE MODULATION, IN PARTICULAR FOR ELECTRON BEAM LITHOGRAPHY

(71) Applicant: ASELTA NANOGRAPHICS, Grenoble (FR)

(72) Inventors: Mohamed Saib, Saint Martin d'Heres (FR); Patrick Schiavone, Villard-Bonnot (FR); Thiago Figueiro, Grenoble (FR)

(73) Assignee: ASELTA NANOGRAPHICS, Grenoble (FR)

( * ) Notice: Subject to any disclaimer, the term of this patent is extended or adjusted under 35 U.S.C. 154(b) by 0 days.

(21) Appl. No.: 15/742,003

(22) PCT Filed: Jul. 19, 2016

(86) PCT No.: PCT/EP2016/067112
§ 371 (c)(1),
(2) Date: Jan. 4, 2018

(87) PCT Pub. No.: WO2017/013085
PCT Pub. Date: Jan. 26, 2017

(65) Prior Publication Data
US 2018/0204707 A1    Jul. 19, 2018

(30) Foreign Application Priority Data

Jul. 20, 2015 (EP) .................. 15306181

(51) Int. Cl.
*H01J 37/317* (2006.01)
*H01J 37/302* (2006.01)

(52) U.S. Cl.
CPC ...... *H01J 37/3023* (2013.01); *H01J 37/3174* (2013.01); *H01J 2237/24507* (2013.01);
(Continued)

(58) Field of Classification Search
CPC ...... H01J 37/30; H01J 37/3002; H01J 37/304; H01J 37/3045; H01J 37/302;
(Continued)

(56) References Cited

U.S. PATENT DOCUMENTS 9,224,577 B2    12/2015  Schiavone et al.
2005/0273753 A1* 12/2005  Sezginer ............ G03F 7/70425
                                                    716/52
(Continued)

FOREIGN PATENT DOCUMENTS

EP    2 952 963 A1    12/2015
JP    2012-212792 A   11/2012

*Primary Examiner* — Jason L McCormack
(74) *Attorney, Agent, or Firm* — Baker & Hostetler LLP

(57) ABSTRACT

A method for transferring a pattern onto a substrate by direct writing by means of a particle or photon beam comprises: a step of producing a dose map, associating a dose to elementary shapes of the pattern; and a step of exposing the substrate according to the pattern with a spatially-dependent emitted dose depending on the dose map; wherein the step of producing a dose map includes: computing at least first and second metrics of the pattern for each of the elementary shapes, the first metric representative of features of the pattern within a first range from the elementary shape and the second metric representative of features of the pattern within a second range, larger than the first range, from the elementary shape; and determining the emitted dose associated to each of the elementary shapes of the pattern as a function of the metrics. A computer program product is provided for carrying out such a method or at least the step of producing a dose map.

16 Claims, 5 Drawing Sheets

(52) U.S. Cl.
CPC ............... *H01J 2237/30461* (2013.01); *H01J 2237/31769* (2013.01)

(58) Field of Classification Search
CPC ............... H01J 37/3026; H01J 37/3023; H01J 37/3174; H01J 37/3175
USPC ...... 250/492.1, 492.2, 492.21, 492.22, 492.3
See application file for complete search history.

(56) References Cited

U.S. PATENT DOCUMENTS

| | | | |
|---|---|---|---|
| 2007/0114463 A1* | 5/2007 | Nakasugi | B82Y 10/00 250/492.23 |
| 2007/0228293 A1 | 10/2007 | Ogasawara | |
| 2012/0211675 A1* | 8/2012 | Tu | G03F 1/84 250/492.3 |
| 2013/0275098 A1 | 10/2013 | Tortai et al. | |
| 2014/0059503 A1* | 2/2014 | Belledent | G06F 17/50 716/55 |
| 2014/0077103 A1* | 3/2014 | Matsumoto | H01J 37/317 250/492.3 |

* cited by examiner

METHOD OF PERFORMING DOSE MODULATION, IN PARTICULAR FOR ELECTRON BEAM LITHOGRAPHY

CROSS-REFERENCE TO RELATED APPLICATIONS

This application is a National Stage of International patent application PCT/EP2016/067112, filed on Jul. 19, 2016, which claims priority to foreign European patent application No. EP 15306181.7, filed on Jul. 20, 2015, the disclosures of which are incorporated by reference in their entirety.

FIELD OF THE INVENTION

The invention relates to the field of micro- and nano-manufacturing, and in particular to that of direct-writing (or "maskless") lithography, such as electron beam lithography (EBL). More precisely, the invention relates to a method for transferring a pattern onto a substrate by direct writing by means of a particle or photon beam using a spatially-dependent exposure dose (dose modulation), and also to a computer program product and an apparatus for carrying out such a method.

BACKGROUND

The expression "direct writing" will be used to designate all the techniques wherein the surface of a substrate is locally modified by directing a narrow or shaped particle or photon beam onto it, without making use of a mask. The meaning of this expression is not limited to the case where the substrate is a semiconductor wafer and also includes, inter alia, the writing of photolithography masks.

Electron beam (e-beam) lithography is the most commonly used technique for performing direct writing—or maskless—lithography. It allows achieving a spatial resolution of a few tens of nanometers or less, and is particularly well suited for manufacturing photolithography masks.

FIG. 1 is a schematic illustration of an electron-beam lithography method and apparatus known from prior art. On this figure, reference 11 corresponds to a substrate—e.g. a silicon wafer or a glass or silica plate—onto which a pattern has to be transferred through direct writing (e.g. e-beam) lithography, reference 12 to a resist layer deposed on a surface of said substrate (the term "substrate" will be used indifferently to designate the bare substrate 11 or the ensemble 10 including the resist layer), reference 20 to an electron beam source, reference 21 to an electron beam generated by said source and impinging onto the resist layer 11, reference 30 to an actuation stage for translating the substrate 10 with respect to the electron beam 20, reference 40 to a computer or processor driving the electron beam source 20 and the actuation stage 30, and reference 41 to a computer memory device storing a program executed by said computer or processor 40. The electron beam source 20 and the actuation stage 30 cooperate for selectively exposing to the electron beam specific regions of the substrate, according to a predetermined pattern. Then, during a so-called development step, the exposed (positive resist) or the unexposed (negative resist) is selectively eliminated, so that the remaining resist reproduces the predetermined pattern or its complement on the surface of the substrate. Afterwards, the portion of the surface of the substrate which is not covered by resist can be etched, and then the remaining resist eliminated.

Electron beam 21 may be a narrow circular beam, in which case the pattern is projected onto the resist point by point, using raster or vector scanning. In industrial applications, however, it is often preferred to use "shaped beams", which are larger and have a rectangular or triangular section. In this case, the pattern to be transferred onto the substrate is decomposed into a plurality of elementary shapes corresponding to the section of the beam. An elementary shape can then be transferred by a single shot—or a series of successive shots for a fixed position of the substrate—with a significant acceleration of the process.

In the real world, the dose actually received by the substrate surface does not fall abruptly at the edges of the beam spot, but it decreases smoothly. Moreover, electrons interacting with the resist and/or the substrate experience forward and backward scattering which broadens the dose distribution beyond the theoretical limits of the incident beam spot; in particular, backscattered electrons can travel by a distance of a few micrometers. The influence of the interactions of primary electrons with the substrate and the resist on the dose distribution is known as "proximity effects".

On FIG. 2, line 200 illustrates the received dose D distribution across an elementary shape (a line of width W, measured along direction x, and much greater length) of a pattern transferred to a resist layer. The received dose D can be obtained by convolving the emitted dose—which may correspond to the design pattern—with a point-spread function representative of the proximity effects. As a result, the received dose takes a value $D_0$ at the center of the elementary shape, remains approximately constant across a width $W_0 < W$ and then decreases smoothly. The edges of the transferred elementary shape (line 210) correspond to the point where the received dose D crosses the energy threshold $E_{Th}$ of the resist. Beyond these edges, the received dose does not go to zero, or it does so slowly, mainly because of forward and backward-scattered electrons coming from the considered elementary shape or adjacent ones. It can be easily understood that increasing the emitted dose (dashed line 201, on the left part of the figure) increases the width of the elementary shape, and vice-versa. Moreover, an increase of the contribution from backscattered electrons from adjacent shapes can be compensated by a reduction of the emitted dose (dashed line 203, on the right part of the figure), and vice-versa.

The correction of proximity effects is essential for ensuring an accurate reproduction of the target pattern on the substrate. It requires the development of an accurate physical model including:

An electronic model, commonly referred to as Point Spread Function (PSF, mentioned above), which allows creating an aerial image of the dose on the surface of the sample. Usually the PSF is expressed by the weighted sum of two or more distribution functions, following e.g. a Gaussian law; see FR1157338 and FR1253389. Each basic function of the PSF, characterized by a radius parameter a, is typically used to model the effects within a disk of radius 3σ. For a two-Gaussian PSF, two radiuses are defined, noted α and $\sigma_b$ (β is sometimes used instead of $\sigma_b$), corresponding to short range (forward scattering) and long range (backscattering) effects, respectively. A parameter q expresses the relative weight (i.e. the energy ratio) of the two contributions.

A resist model takes into account the response of the resist to the exposition to the electron beam. The simplest example is the "constant threshold" model, defining a constant energy level of the aerial image above which the resist is exposed, and therefore the pattern is printed.

Once the physical model is calibrated, it is possible to proceed to the stage of correcting, or compensating, the electronic proximity effects (PEC). There are three possible types of correction:

PEC by dose modulation (DM): the exposure dose of each elementary shape of the pattern is adjusted according to the parameters of the physical model.

PEC by geometry modulation (GM): the geometry the elementary shapes of the pattern is modified depending on the settings of the physical model and for a known exposure dose.

PEC by modulation of the dose and geometry (DMG): dose and geometry are simultaneously adjusted for each elementary shape of the pattern.

The paper by Takayuki Abe et al. "High-Accuracy Proximity Effect Correction for Mask Writing", Japanese Journal of Applied Physics, Vol. 46, No. 2, 2007, pp. 826-833 describes a commonly used method of performing dose correction modulation. According to the simplest form of this method, the normalized correction dose at a position r=(x,y) of the surface of the sample is given by:

$$D_{Abe} = \frac{\frac{1}{2}+\eta}{\frac{1}{2}+\eta \iint_{pattern} g(r-r') \cdot dr'} \qquad (eq. 1)$$

where the integral is computed over the whole pattern to be transferred (or the relevant portion thereof) and the distribution g(r) of the energy deposited by backscattered electron satisfies the normalization condition $\iint_{-\infty}^{+\infty} g(r) dr = 1$.

Typically, g(r) is a Gaussian distribution of standard deviation $\sigma_b$, typically truncated at $3\sigma_b$, taking into account long-range effects (mainly backscattering):

$$g(r) = A \cdot \exp[(-(r-r')^2/\sigma_b^2)] \qquad (eq. 2)$$

where A is a normalization constant.

If the pattern density is defined by:

$$\text{Density} = \iint_{pattern} g(r-r') \cdot dr'^2 \qquad (eq. 3)$$

then (eq. 1) can be rewritten in the simpler form:

$$D_{Abe} = \frac{\frac{1}{2}+\eta}{\frac{1}{2}+\eta \cdot \text{Density}} \qquad (eq. 4)$$

It has been found that dose modulation is simpler to implement than geometry modulation, but less precise. The invention aims at overcoming this drawback of the prior art; more precisely it aims at improving the precision of the received dose modulation on one- and two-dimensional critical shapes (i.e. with narrow width, space or density) without increasing—or even reducing—its implementation complexity.

Document US 2014/077103 describes a method of performing direct writing using a charged particle beam, wherein different dose correction formulas are applied for elementary shapes situated inside the pattern or at its periphery.

Document US 2007/228293 describes a method of performing direct writing using a charged particle beam, wherein a dose correction factor is computed as a function of both a pattern density and of a parameter depending on the shape of the pattern.

More specifically, document JP 2012/212792 describes a method of performing direct writing using a charged particle beam, wherein the dose is computed by taking into account a line width and a pattern density. A "line width" is not easily defined for every kind of pattern.

SUMMARY OF THE INVENTION

An object of the present invention, achieving these aims, is a method for transferring a pattern onto a substrate by direct writing by means of a particle or photon beam, the method comprising:

a step of producing a dose map, associating a dose to each of a plurality of elementary shapes of said pattern; and a step of exposing the substrate according to the pattern with a spatially-dependent emitted dose depending on said dose map;

characterized in that said step of producing a dose map includes:

computing at least a first and a second metrics of the pattern for each of said elementary shapes, the first metric being representative of features of the pattern within a first range from the elementary shape and the second metric being representative of features of the pattern within a second range, larger than the first range, from the elementary shape; and determining the emitted dose associated to each of said elementary shapes of the pattern as a function of said metrics.

According to particular embodiments of the invention

Said first metric may be a critical dimension of the pattern and said second metric may be a pattern density. In this case, the method may comprise computing the critical dimension from an overlap factor between the pattern and a disk centered on geometrical center of the elementary shape, the diameter of the disk being such that it partially extends beyond an edge of the pattern. More particularly, the disk may be the smallest of a predetermined finite set of disks centered on the geometrical center of the elementary shape to partially extend beyond said edge of the pattern. The method may also comprise computing the density value of each elementary shape by convolving the pattern with a point spread function of the particle or photon beam.

Alternatively, the first metric may be a density value computed by convolving the pattern with a point spread function of the particle or photon beam characterized by a first radius and the second metric be a density value computed by convolving the pattern with a point spread function of the particle or photon beam characterized by a second radius, larger than the first radius.

Said step of exposing the substrate may be performed by projecting shaped particle or photon shots onto said substrate, each shot corresponding to an elementary shape of the pattern, and wherein said dose map associates a dose to each of said shots.

Said step of determining the emitted dose associated to each of said elementary shapes of the pattern as a function of said metrics may be carried out by using a pre-computed look-up table. More particularly, said step of producing a dose map may include directly reading the dose associated to each of said elementary shapes from the look-up table. Alternatively, the step may include obtaining the dose associated to each of said elementary shapes by interpolating between two values read from the look-up table.

The method may further comprise a preliminary calibration step of determining a relation between said metrics and an emitted dose by using numerical simulations or experimental tests to find optimal doses for a plurality of reference patterns, each being representative of a different set of values of said metrics, according to a predetermined optimality criterion. At least some of said reference patterns may include a one- or two-dimensional grating, and/or aid optimal criterion may consist in maximizing similarity between the reference pattern and the corresponding pattern transferred onto the substrate.

Said beam may be an electron beam.

The method may further comprise: before said exposing the substrate, a step of depositing a resist layer on it; and after said exposing the substrate, a step of developing the resist layer.

Another object of the invention is a computer program product comprising computer-executable code for causing a computer to produce a dose map, associating an emitted dose to each of a plurality of elementary shapes of a pattern to be transferred onto a substrate by direct writing by means of a particle or photon beam, by computing at least two metrics for each of said elementary shapes of the pattern, and determining the emitted dose associated to each of said elementary shapes of the pattern as a function of said metrics. The computer program product may further comprise computer-executable code for causing a computer to determine a relation between said metrics and an emitted dose by using numerical simulations or experimental tests to find optimal doses for a plurality of reference patterns, each being representative of a different set of values of said metrics, according to a predetermined optimality criterion. The computer program product may further comprising computer-executable code for carrying out a method as outlined above by causing a computer to drive a source of said particle or photon beam in order to expose said substrate according to said pattern with a spatially-dependent dose depending on said dose map.

BRIEF DESCRIPTION OF THE DRAWINGS

Additional elementary shapes and advantages of the present invention will become apparent from the subsequent description, taken in conjunction with the accompanying drawings, wherein.

DETAILED DESCRIPTION

The invention will be described with reference to shaped-beam EBL (including variable-shaped beams), but it is not limited to this case. Generalization to vector or raster scan lithography or to other micro- or nano-manufacturing techniques involving particles (not necessarily electrons) or photon beams is straightforward. In the case of scanning beam lithography, the "elementary shapes" of the pattern for which the emitted dose has to be calculated are the projections on the substrate of the narrow particle or photon beam.

The present inventors have realized that the conventional (e.g. Abe's) approach to emitted Dose Modulation is not entirely satisfactory, especially for narrow patterns, because the emitted dose is only computed as a function of the density, and therefore only depends on a "long range" metric, without taking into account local or semi-local features of the pattern. The present invention overcomes this limitation by determining the dose as a function of both the density and the critical dimension of each shape. The idea at the basis of the invention is the following: an "optimal" dose is computed for each of a plurality of reference patterns, each characterized by at least two pattern metrics, one depending on very local (short range) features of the pattern and the other one depending in longer-range features. For instance, the metrics may be density and a critical dimension, or a long-range density and a short-range density. The reference patterns are chosen so that they sample the parameter plane (or, more generally, hyperplane) defined by these metrics. This way, a look-up table can be obtained relating (first metrics, second metrics) pairs to the corresponding optimal exposure doses. The look-up table is then used to determine the dose associated to each specific EBL shot, by direct reading or interpolation.

Contrarily to the methods of US 2014/077103 and US 2007/228293, according to the invention the optimal dose associated to a geometrical shape (or "shot") of the pattern does not only depend on the shape itself, but on local features of the pattern situated in its proximity. The calibration process is much simpler than in the case of JP 2012/212792, as the dose is directly calculated from the PSFs.

Figure 3:
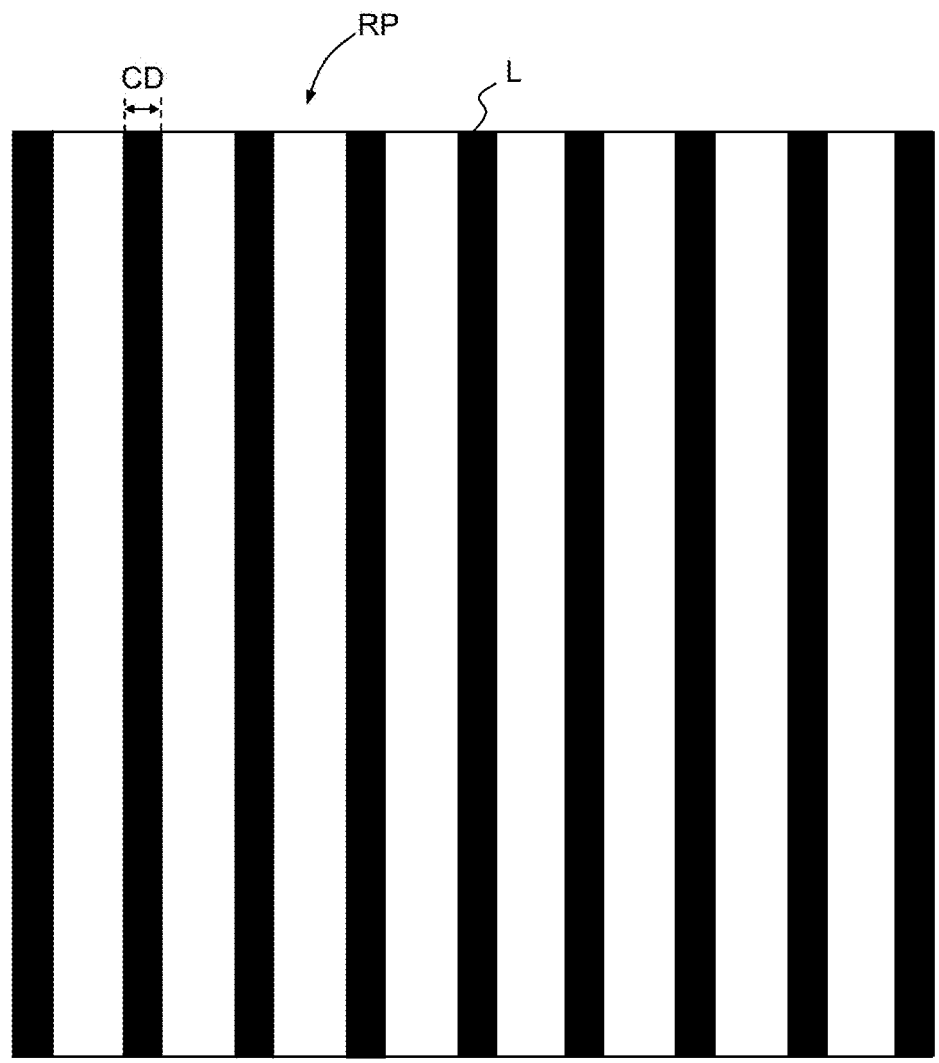
FIG. 3 shows a reference pattern characterized by a critical dimension and a density value, used for computing a dose look-up table.

FIG. 3 shows an exemplary reference pattern RP formed by a one-dimensional grating of lines L having a same width and spacing. The critical dimension CD corresponds to the width of said lines and the pattern density is calculated using equation 3 above. The optimal emitted dose is the one which maximizes the similarity between the reference pattern and the corresponding pattern transferred onto the substrate by EBL. Similarity may be evaluated by comparing the dimensions and/or the contours of the reference and transferred patterns. This optimal emitted dose is determined by trial-and-error, using either detailed physical simulations or actual experiments.

Figure 4:
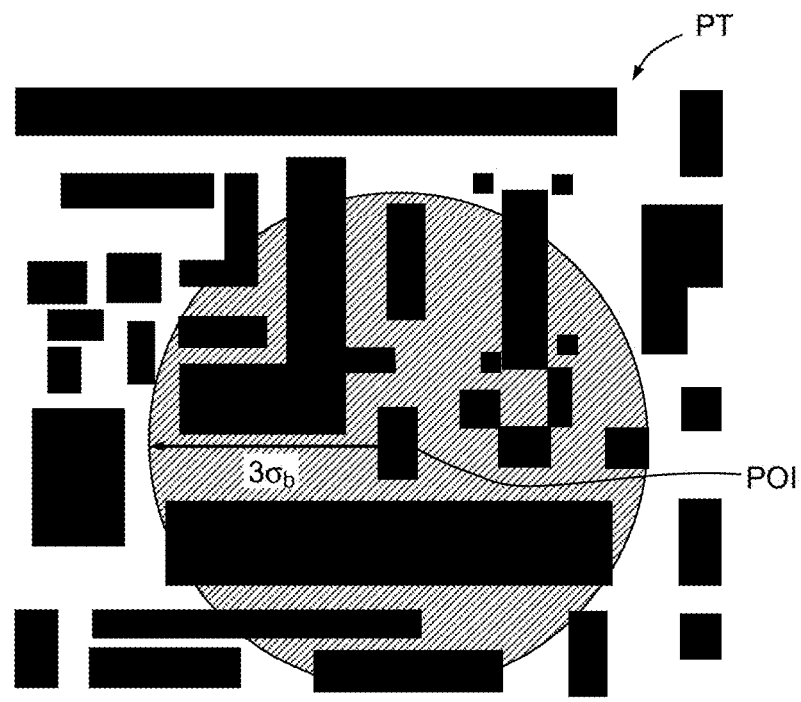
FIG. 4 illustrate the determination of the density of an elementary shape of a pattern to be transferred to a substrate

As illustrated on FIG. 4, the density for a point—called point of interest, POI—is determined by computing the convolution of the pattern PT to be transferred onto the substrate with the point spread function of the electron beam, or only its long-range contribution, and by taking the value of said convolution at the POI. It is generally assumed that the point spread function goes to zero beyond a distance of $3\sigma_b$, therefore in practice it is only necessary to take into account the portion of the pattern comprised within a circle of radius $3\sigma_b$ centered on the POI.

Figure 5:
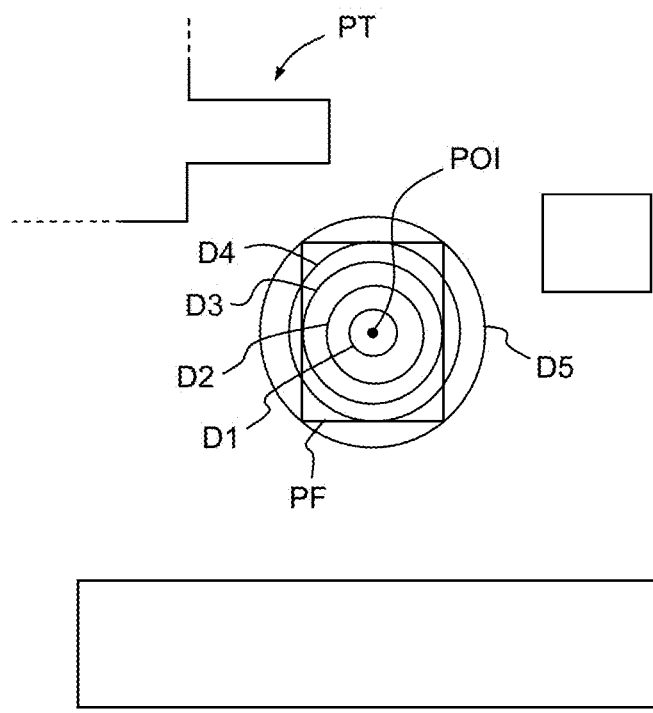
FIG. 5 illustrates the determination of the critical dimension of an elementary shape of a pattern to be transferred to a substrate.

Defining the critical dimension for a non-trivial pattern is less straightforward. A possible way of doing it is illustrated on FIG. 5. A series of disks of increasing diameter D1, D2, D3, D4 and D5 and centered on the point of interest are superposed to the pattern. As it can be seen on FIG. 5, the three smallest disks—D1, D2 and D3—are fully contained within the pattern elementary shape PF containing the point of interest POI (a "pattern elementary shape" is a connected region of the pattern to be transferred, corresponding to a region of the substrate that will be exposed to the electron beam), and D4 is the smallest disk stretching beyond said elementary shape—and therefore beyond an edge of the pattern, corresponding to the limit of a region of the substrate that will be exposed to the electron beam. The critical dimension associated to the point of interest is therefore comprised between the diameters of disks D3 and D4. Mathematically, an "overlap factor" $OF_i$ can be defined for each disk Di (i=1-5):

$$OF_i = \frac{\iint \chi_{Pattern} \cdot \chi_{Din}}{A(Di)} \quad \text{(eq. 5)}$$

where A(Di) is the area of the disk Di, $\chi_{Pattern}$ is the indicator function of the pattern ($\chi_{Pattern}$=1 inside the pattern, 0 outside) and $\chi_{Di}$ is the indicator function of the $i^{th}$ disk ($\chi_{Di}$=1 inside the disk Di, 0 outside). Clearly, $OF_i$=1 when the disk is completely contained within an elementary shape of the pattern and $OF_i$<1 when it stretches beyond the limits of such an elementary shape. The critical dimension of the elementary shape can then be defined as:

$$CD = \sqrt{\frac{4A(Di)}{\pi} \cdot OF_i} \quad \text{(eq. 6)}$$

the index "i" taking the smallest value for which $OF_i$<1.

This method of computing the critical dimension is not an essential feature of the invention, and alternative approaches can be devised.

The POI may be the geometrical center of a shaped spot, constituting an "elementary shape" of the pattern; in general, shape PF is constituted by a plurality of adjacent, or partially overlapping, shots. By applying the methods described above with reference to FIGS. 4 and 5, a (density; critical dimension) pair is then associated to each shot. In general, there will be no entry of the look-up table corresponding exactly to this pair, but it is nevertheless possible to use the table to find a nearly optimal dose for the shot. For example, the dose associated to a particular (density; critical dimension) pair can be taken equal to the optimal dose for the nearest pair for which an entry of the look-up table exists, the relevant metrics being e.g. a Euclidian distance in the (density-critical dimension) space. It is also possible to use interpolation (e.g. linear, quadratic, spline . . . ) to achieve more accurate results.

Figure 6A:
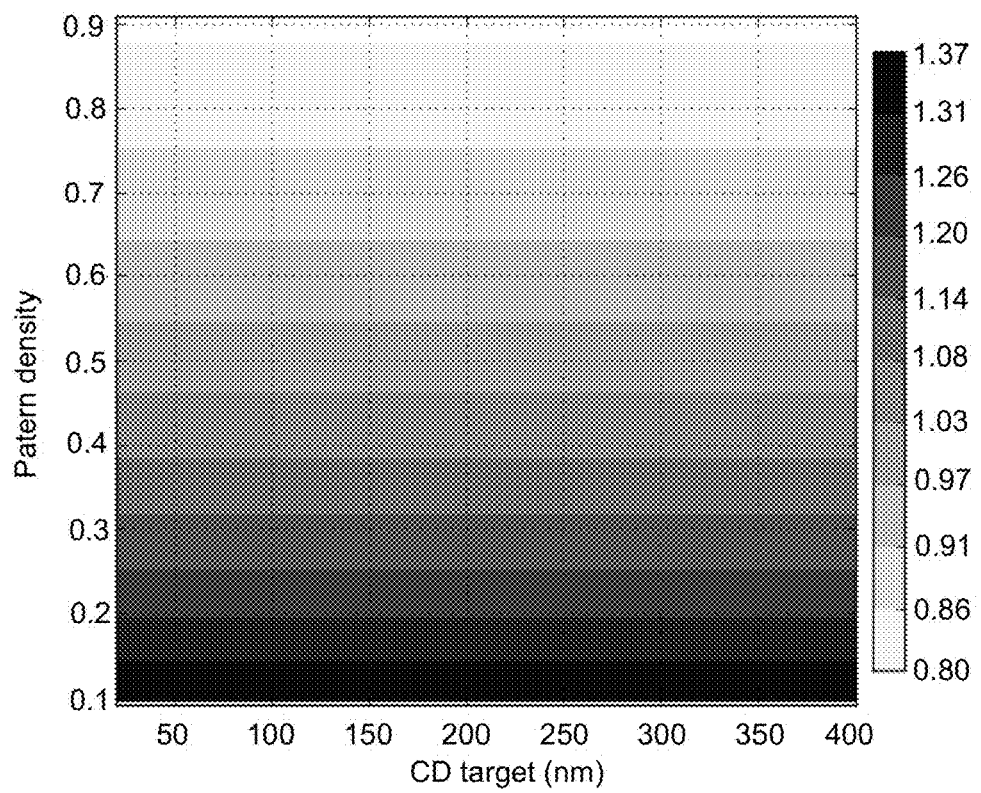
FIGS. 6A-6C are three plots illustrating the technical effect of the invention.
Figure 6B:
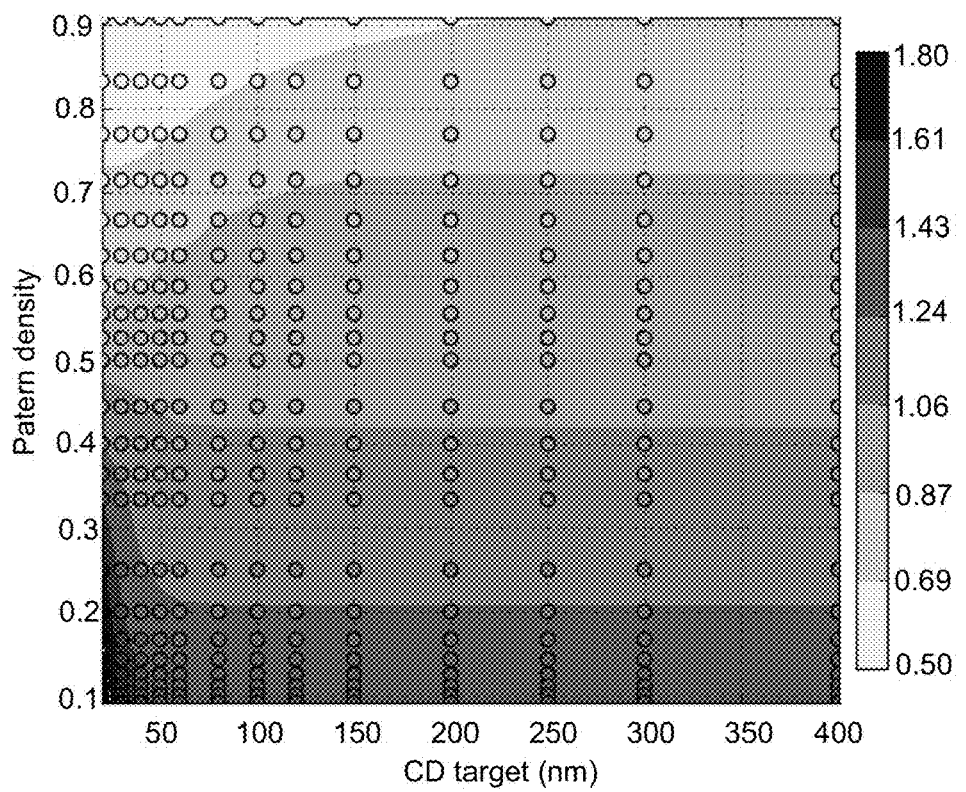
Figure 6C:
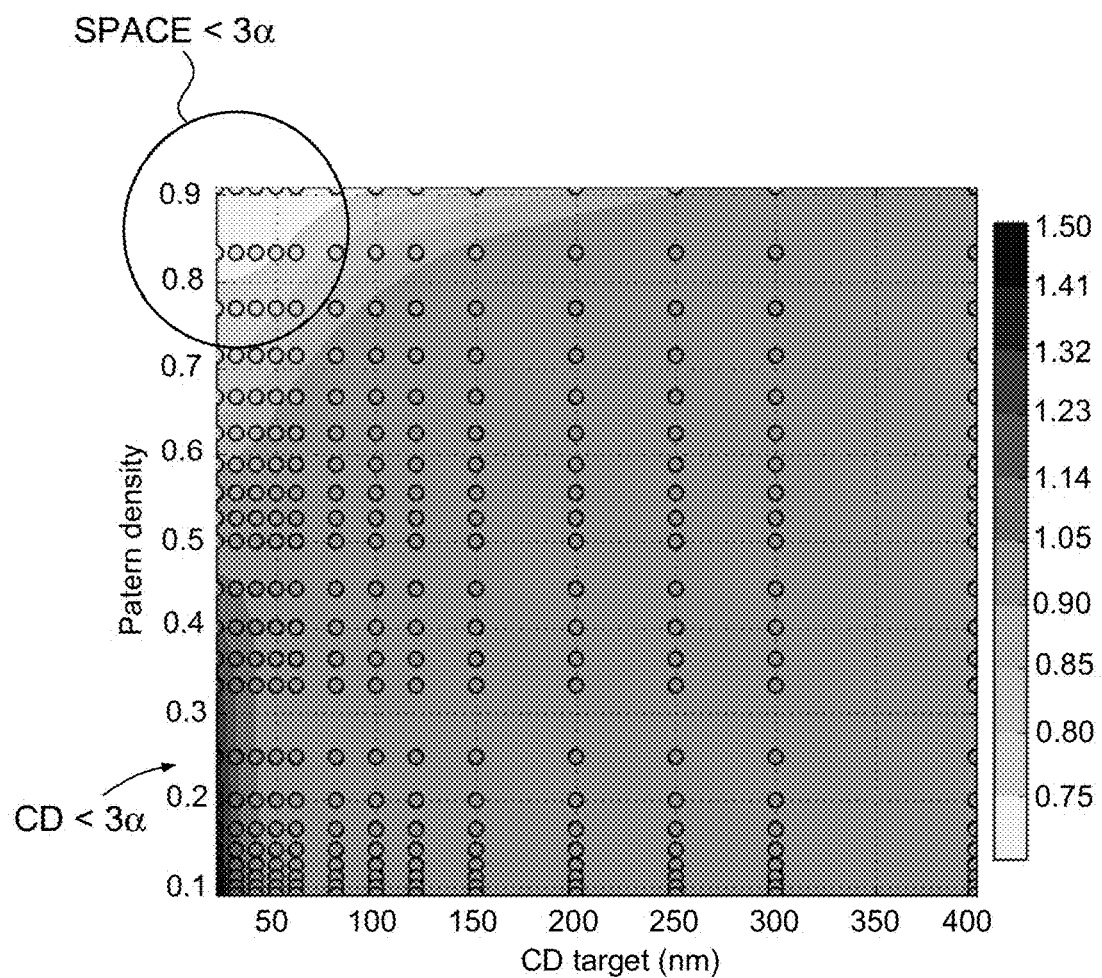

FIG. 6A shows, in grayscale, the emitted dose computed using Abe's formula (equations 1 or 4) for a plurality of reference patterns of the kind of FIG. 3, densely sampling the (density-critical dimension) plane. It can be seen that $D_{Abe}$ only depends on the density, and is independent from the critical dimension (and indeed this is apparent from equation 4). FIG. 6B shows the optimal emitted dose for the same reference patterns, determined by trials and error using numerical simulations, as explained above. It can be seen that, unlike Abe's dose, the optimal emitted dose depends on both critical dimension and density. FIG. 6C shows the ratio between the optimal dose of FIG. 6B and the Abe's dose of FIG. 6A. It can be seen that Abe's dose is particularly inaccurate for small critical dimensions (approximately, CD<3α, α being the standard deviation of a Gaussian function expressing short-range proximity effects) and for small spacing (SPACE<3α, where for instance, for one-dimensional patterns SPACE=CD*(1−Density)/Density). Dots on FIGS. 6B and 6C illustrate the much sparser sampling of the (density-critical dimension) plane which is used for calculating the look-up table.

Spacing depends on both the critical dimension and the pattern density. The look-up table could also express the optimal dose as a function of critical dimension and spacing, or of pattern density and spacing, instead of using critical dimension and density. Indeed, the look-up table could be based on any two functions of critical dimension and pattern density (provided they are not simply proportional to each other). It is also possible to take into account additional parameters by using a multidimensional look-up table.

Figure 1:
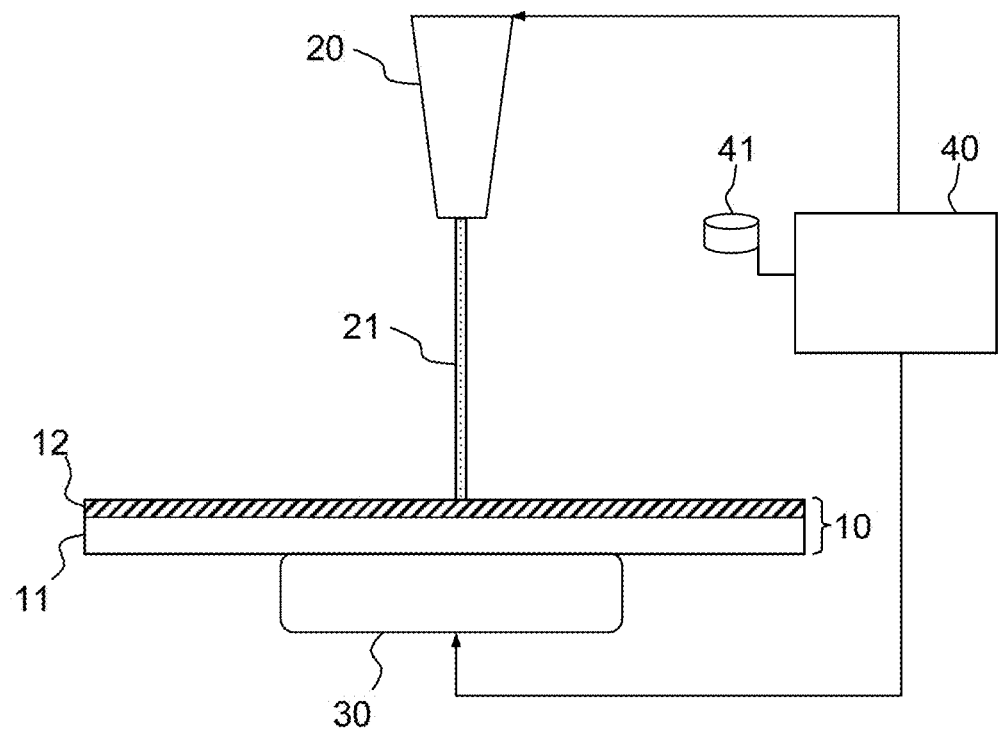
FIG. 1, described above, is a schematic illustration of an electron-beam lithography method and apparatus known from prior art.
Figure 2:
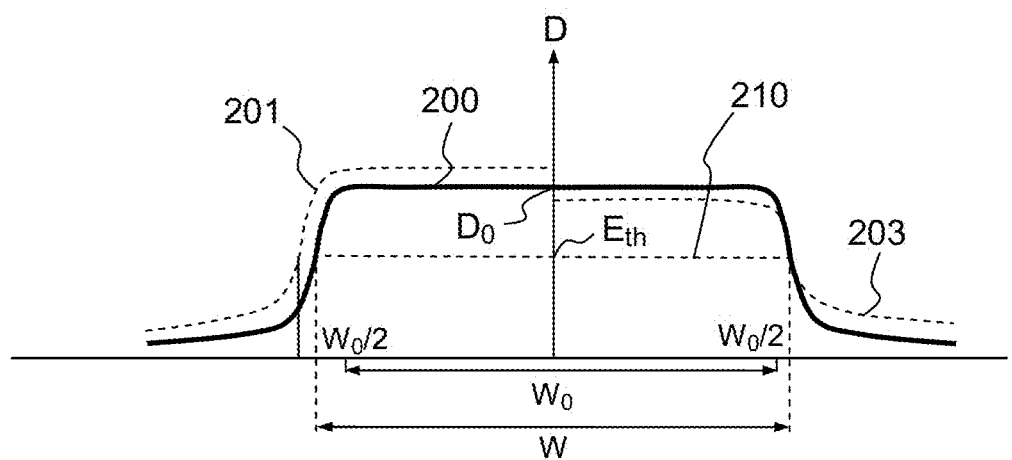
FIG. 2, also described above, illustrates the influence of the dose distribution on the size of the elementary shapes of the pattern transferred onto the substrate.

The inventive method is typically implemented by executing a suitable program on a computer. Said computer may directly drive the EBL apparatus (cf. computer or processor 40 on FIG. 1) or simply produce data to be provided to the EBL apparatus. The program comprises two main modules: a first one, which receives as an input a fractured pattern (i.e. a pattern decomposed into elementary shapes corresponding to EBL shots) and computes a critical dimension and a pattern density for each elementary shape of this pattern; and a module that receives said critical dimension and pattern density and uses a pre-computed look-up table to determine and output a dose for each said elementary shape. A same program can be able to use different pre-computed look-up tables, corresponding to different processes (a process being defined by a PSF and a resist threshold). The program itself and the look-up table(s) may be stored on the same or on different, and possibly remote, computer-readable storage media. For example, the program and the look-up table may be stored in the memory device 41 of the processor of FIG. 1. The program may also include a numerical simulation module and a library of reference patterns for computing the look-up table(s). Alternatively, the program may only include the dose map computation module, possibly accompanied by the numerical simulation module, the EBL apparatus being driven by a separate program, receiving the dose map as its input.

The invention has been described with reference to a particular embodiment, but is not limited to it.

For example, the reference patterns, or at least some of them, may not necessarily be one-dimensional (i.e. line) gratings; admissible reference patterns may include bi-dimensional gratings (e.g. regular dot patterns, or grids), or even non-grating pattern, e.g. issued from real designs.

Critical dimension and pattern density are only two of the possible metrics which can be used to compute the optimal emitted dose. Other metrics may be used for this purpose, such as SPACE (defined above); other suitable metrics are described in the following papers:

J.-G. Park, S.-W. Kim, S.-B. Shim, S.-S. Suh, and H.-K. Oh (2011), "The effective etch process proximity correction methodology for improving on chip CD variation in 20 nm node DRAM gate", Design for Manufacturability though Design-Process Integration V, proc. SPIE vol 7974.

S. Sato, K. Ozawa, and F. Uesawa (2006), "Dry-etch proximity function for model-based OPC beyond 65-nm node", proc. SPIE vol 6155.

It is also possible to use two (or more) densities calculated using different ranges.

The optimal emitted dose may be computed as a function a plurality (i.e. two or more) of said metrics. For instance, the critical dimension may be replaced by a short range density defined as:

$$\text{Short range density} = \iint_{pattern} g_{SR}(r-r') \cdot dr' \quad \text{(eq. 7)}$$

where $$g_{SR}(r) = A_{SR} \cdot \exp[(-(r-r')^2/\sigma_a^2)] \quad \text{(eq. 8)}$$

$A_{SR}$ being a normalization constant and $\sigma_a$ a parameter smaller than $\sigma_b$ and typically of the same order of magnitude of the short-range PSF radius $\alpha$, i.e. $0.1 \cdot \alpha \leq \sigma_a \leq 10 \cdot \alpha$. Using a small value for $\sigma_a$ improves the accuracy of the method, but may lead to high dose values, and therefore to long writing processes. Conversely, large $\sigma_a$ values reduce the maximum dose value and therefore accelerate writing, but at the expense of accuracy (which may be improved using geometric proximity correction without adverse effects on writing speed).

A look-up table constitutes a useful tool for representing the relation between a given set of values of the metrics and the corresponding optimal emitted dose, but there are alternatives. For example, it is possible to determine the coefficients of a multi-variable polynomial function expressing the dose as a function of the metrics, storing these coefficients in a computer memory and using them for calculating the optimal emitted dose instead of reading it from a pre-computed table.

It is also possible to separately compute a first component of the emitted dose as a function of a first metrics and a second component of the emitted dose as a function of a second metrics, and to combine them.

Moreover, dose modulation may serve other purposes than maximizing the similarity between a reference and a transferred pattern. Said similarity may be ensured using geometry modulation, and dose modulation may then be used to optimize other suitable criteria—i.e. for reducing the exposition time, minimizing the simulation error, reducing the roughness of the edges of the elementary shapes, etc.

The invention claimed is:

1. A method for transferring a pattern onto a substrate by direct writing by means of a particle or photon beam, the method comprising:
    a step of producing a dose map, associating a dose to each of a plurality of elementary shapes of said pattern; and
    a step of exposing the substrate according to the pattern with a spatially-dependent emitted dose depending on said dose map;
    wherein said step of producing a dose map includes:
        computing at least a first and a second metrics of the pattern for each of said elementary shapes, said first metric being representative of features of the pattern within a first range from the elementary shape and said second metric being representative of features of the pattern within a second range, larger than the first range, from the elementary shape, wherein said first metric is a critical dimension of the pattern and said second metric is a pattern density;
        computing the critical dimension from an overlap factor between the pattern and a disk centered on geometrical center of the elementary shape, a diameter of the disk being such that it partially extends beyond an edge of the pattern; and
        determining the emitted dose associated to each of said elementary shapes of the pattern as a function of said metrics.

2. The method according to claim 1 wherein the disk is the smallest of a predetermined finite set of disks centered on the geometrical center of the elementary shape to partially extend beyond said edge of the pattern.

3. The method according to claim 1 comprising computing the density value of each elementary shape by convolving the pattern with a point spread function of the particle or photon beam.

4. The method according to claim 1 wherein the first metric is a density value computed by convolving the pattern with a point spread function of the particle or photon beam characterized by a first radius and the second metric is a density value computed by convolving the pattern with a point spread function of the particle or photon beam characterized by a second radius, larger than the first radius.

5. The method according to claim 1 wherein said step of exposing the substrate is performed by projecting shaped particle or photon shots onto said substrate, each shot corresponding to an elementary shape of the pattern, and wherein said dose map associates a dose to each of said shots.

6. The method according to claim 1 wherein said step of determining the emitted dose associated to each of said elementary shapes of the pattern as a function of said metrics is carried out by using a pre-computed look-up table.

7. The method according to claim 6 wherein said step of producing a dose map includes directly reading the dose associated to each of said elementary shapes from the look-up table.

8. The method according to claim 6 wherein said step of producing a dose map includes obtaining the dose associated to each of said elementary shapes by interpolating between two values read from the look-up table.

9. The method according to claim 1 further comprising a preliminary calibration step of determining a relation between said metrics and an emitted dose by using numerical simulations or experimental tests to find optimal doses for a plurality of reference patterns, each being representative of a different set of values of said metrics, according to a predetermined optimality criterion.

10. The method according to claim 9 wherein at least some of said reference patterns include a one- or two-dimensional grating.

11. The method according to claim 9 wherein said optimal criterion consists in maximizing similarity between the reference pattern and the corresponding pattern transferred onto the substrate.

12. The method according to claim 1 wherein said beam is an electron beam.

13. The method according to claim 1 further comprising:
    before said exposing the substrate, a step of depositing a resist layer on it; and
    after said exposing the substrate, a step of developing the resist layer.

14. A computer program product comprising:
    computer-executable code for causing a computer to produce a dose map, associating an emitted dose to each of a plurality of elementary shapes of a pattern to be transferred onto a substrate by direct writing by means of a particle or photon beam, by: computing at least a first and a second metrics of the pattern for each of said elementary shapes, said first metric being representative of features of the pattern within a first range from the elementary shape and said second metric being representative of features of the pattern within a second range, larger than the first range, from the elementary shape, wherein said first metric is a critical dimension of the pattern and said second metric is a pattern density; computing the critical dimension from an overlap factor between the pattern and a disk centered on geometrical center of the elementary shape, a diameter of the disk being such that it partially extends beyond an edge of the pattern; and determining the emitted dose associated to each of said elementary shapes of the pattern as a function of said metrics.

15. The computer program product according to claim 14, further comprising computer-executable code for causing a computer to determine a relation between said metrics and an emitted dose by using numerical simulations or experimental tests to find optimal doses for a plurality of reference patterns, each being representative of a different set of values of said metrics, according to a predetermined optimality criterion.

16. A computer program product comprising computer-executable code for causing a computer to produce a dose map, associating an emitted dose to each of a plurality of elementary shapes of a pattern to be transferred onto a substrate by direct writing by means of a particle or photon beam, by computing at least two metrics for each of said elementary shapes of the pattern, and determining the emitted dose associated to each of said elementary shapes of the pattern as a function of said metrics, further comprising computer-executable code for carrying out a method according to claim 1 by causing a computer to drive a source of said particle or photon beam in order to expose said substrate according to said pattern with a spatially-dependent dose depending on said dose map.

* * * * *